(12) United States Patent
Zanchi et al.

(10) Patent No.: US 7,345,528 B2
(45) Date of Patent: Mar. 18, 2008

(54) METHOD AND APPARATUS FOR IMPROVED CLOCK PREAMPLIFIER WITH LOW JITTER

(75) Inventors: Alfio Zanchi, Dallas, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 176 days.

(21) Appl. No.: 11/125,960

(22) Filed: May 10, 2005

(65) Prior Publication Data

US 2006/0255859 A1 Nov. 16, 2006

(51) Int. Cl.
G06G 7/12 (2006.01)
H03F 3/16 (2006.01)
(52) U.S. Cl. ...................... 327/562; 330/277
(58) Field of Classification Search ........ 327/560–563; 330/252, 277
See application file for complete search history.

(56) References Cited

U.S. PATENT DOCUMENTS 5,939,942 A * 8/1999 Greason et al. ............. 330/253
6,826,390 B1 * 11/2004 Tamura .................... 455/226.1
7,099,098 B2 * 8/2006 Posat et al. ................... 360/67

OTHER PUBLICATIONS

Bugeja, A. R., et al. "Design of a 14b 100MS/s Switched-Capacitor Pipelined ADC in RFSiGe BiCMOS," IEEE, 2001, pp. 428-431.
Haddad, R. A. et al., "Digital Signal Processing," W. H. Freeman and Co., 1991, pp. 36-38.
"LTC1748, 14-Bit, 80Msps Low Noise ADC," Linear Technology Corp., 2003, pp. 1-20.

McNeill, J. A., "Jitter in Ring Oscillators," IEEE Journal of Solid-State Circuits, Jun. 1997, pp. 870-879, vol. 32, No. 6.
Sedra, A. S., "Microelectric Circuits," 1991, pp. 1030-1031, Saunders College Publishing.
Shinagawa, M., et al., "Jitter Analysis of High-Speed Sampling Systems," IEEE Journal of Solid-State Circuits, Feb. 1990, pp. 220-224, vol. 25, No. 1.
Zanchi, A., et al., "A 16b 65MSps Pipeline ADC Core with 230fs Clock Jitter in 3.3V SiGe BiCMOS: from Simulation to Silicon," IEEE Journal of Solid-State Circuits, 2004 pp. 177-180.
Zanchi, A., et al., "Measurement and Spice Prediction of Sub-Picosecond Clock Jitter in A-to-D Converters," IEEE, 2003, pp. 557-560.

* cited by examiner

*Primary Examiner*—Dinh T. Le
(74) *Attorney, Agent, or Firm*—Wade J. Brady, III; Frederick J. Telecky, Jr.; Warren L. Franz

(57) ABSTRACT

A clock signal preamplifier comprises complementary pairs of differentially coupled transistors, with an output signal coupled to an inverter further comprising a totem-pole arrangement of complementary MOSFET transistors. The input signal to the preamplifier is typically sinusoidal, and the output signal is rectangular. Preferably, the differentially coupled transistors are bipolar, and a pair of diode clamper circuits with bipolar transistors is preferably coupled to the complementary pairs of differentially coupled transistors. A reference voltage source is coupled to the control terminals of the clamper transistors. A reference voltage source, which preferably comprises a totem-pole arrangement of complementary MOSFET transistors with its output node is coupled to its input node, provides a reference voltage for the diode clamper circuits. Preferably, MOSFET transistors of the reference voltage source and MOSFET transistors of like kind of the inverter are configured to have substantially identical threshold voltages.

22 Claims, 12 Drawing Sheets

METHOD AND APPARATUS FOR IMPROVED CLOCK PREAMPLIFIER WITH LOW JITTER

TECHNICAL FIELD

This invention relates generally to hardware implementations of clock synchronization circuits, and in particular, to a method and implementation of digital clock synchronization circuits for analog-to-digital conversion comprising an integrated circuit.

BACKGROUND

An essential element of design in digital systems that broadly affects system performance is the creation and distribution of a precise clock signal to serve as a stable timing reference for synchronizing digital logic, particularly for sampling analog signals prior to their conversion to a digital form or for converting digital signals back to an analog form. As the role of digital logic becomes more pervasive in numerous signal-processing applications, and as the conversion of signals to digital format occurs earlier in the signal processing chain to reduce system cost and size, system performance in numerous applications such as cellular telephony and high-performance television receivers is limited by clock signal timing jitter. Applications requiring signal sampling are also frequently found in switched-capacitor system implementations and in fiber-optic systems. Clock signal timing jitter is now generally recognized as a fundamentally limiting factor of the accuracy of a signal processing sequence.

The noise contribution due to the uncertainty of the sampling instant of a high frequency input signal is directly affected by timing jitter in both the clock source and the clock distribution network. The external sinusoidal time reference produced by a low phase-noise source is usually bandpass filtered to reduce short-term timing uncertainty, usually using an external quartz filter which can reduce timing jitter from 1 ps to less than 100 fs, and is converted into a differential sinusoidal waveform using a transformer. Differential waveforms are generally the cleanest and most power-efficient signal arrangements for high-frequency synchronization. The use of external narrow-band filters to reduce short-term timing uncertainty of a sinusoidal signal is described by A. Zanchi, et al., in the paper titled "Measurement and Spice Prediction of Sub-Picosecond Clock Jitter in A-to-D Converters," in the Proceedings of the ISCAS 2003, held in Bangkok, Thailand, May, 2003, on pages 557-560. But before a two-phase, non-overlapped, clock generation circuit that supplies downstream logic elements can be driven, the clock signal must be preconditioned, which is usually accomplished using a low-noise clock-signal preamplifier.

The general function of a front-end clock signal preamplifier is to amplify and convert a sinusoidal timing reference signal into a clock signal with a rectangular waveform supplied on a differential output that is precisely time aligned with the original sinusoidal reference signal, and without timing jitter in the amplification and conversion process. A clock signal with a rectangular waveform is generally used to gate the periodic sampling instant for analog-to-digital converters (ADCs). Differential outputs are generally used to reduce the common-mode component of a signal; however, the differential output of the preamplifier can be used in both a differential clock distribution circuit, or a single-ended one.

The performance of ADCs can be directly related to timing jitter by a well-known formula described by M. Shinagawa, et al., in "Jitter Analysis of High Frequency Sampling Systems," published in the IEEE Journal of Solid State Circuits, Vol. 25, No. 1, February 1990, on pages 220-224:

$$SNR_{jitter} = -20 \cdot \log_{10}(2\pi f_{IN} \sigma_T),$$

where $SNR_{jitter}$ is the signal-to-noise contribution (in dB) to the digital signal due to sampling timing jitter of the incoming analog signal, $f_{IN}$ is the nominal frequency (in Hz) of the signal being sampled, and $\sigma_T$ is the rms (root-mean square) timing jitter (in seconds) of the periodic sampling process. Intuitively, the noise produced by an ADC is proportional to the timing jitter and the slope of the voltage waveform being converted. The noise contribution due to quantization, i.e., due to imprecisely representing a signal with a limited number of bits, can be estimated from the equation:

$$SNR_{quantization} = 1.5 + 6 \cdot k,$$

where $SNR_{quantization}$ is the noise contribution in dB due to quantizing the data, and k is the number of bits used to represent the data, as described by R. A. Haddad, et al., in "Digital Signal Processing," W. H. Freeman and Co., 1991, page 38. The equation above has been adjusted to reflect typical ADC rms input voltage relative to the full-scale input voltage of the ADC. Thus, when performing digital conversion, for example, for a 65 MS/s (megasamples per second) signal using a 16 bit ADC with 300 ps of timing jitter, the theoretical signal-to-noise ratio (SNR) is dominated by almost 20 dB by the effect of the timing jitter in the sampling process over the effect of the 16-bit quantization.

A typical two-phase clock generation and distribution circuit of the prior art is shown in FIG. 1. A differential input voltage signal with a sinusoidal waveform is coupled to the clock signal preamplifier 102 at circuit node 101. The clock signal preamplifier provides clock signal amplification, conversion to a rectangular waveform sufficient in output level for coupling to the downstream circuit blocks. A two-phase clock-signal generator, 104, typically formed with inverters such as inverter 106, and NAND gates, such as NAND gate 108, with rectangular-waveform outputs, produces two-phase clock output signals such as on leads 103 and 105. The rectangular waveform clock signals are distributed to downstream logic circuits as needed, such as by distribution buffer 112, typically formed with additional inverters, such as inverter 114 and inverter 110.

The timing jitter of the clock phase driving a signal sampling device, which ultimately limits the signal-to-noise figure of an ADC or any sampled-signal arrangement, is the rms sum of the jitter contributions from the cascaded signal-processing blocks, i.e., from the external signal source, through the clock signal preamplifier, and through the chain of buffers such as illustrated in FIG. 1. Each element of the clock signal processing chain contributes edge jitter to the clock signal.

The general problem of minimization of the overall timing jitter, can be described as follows:

a) To reduce the clock source noise, narrow-band filtering of the external signal source is required. In the frequency range of tens of MHz, the best instrumentation available to date, such as an HP8644B low phase-noise signal source or a Wenzel signal generator, synthesizes sinusoids with jitter in excess of 1.3 ps; after a narrow bandpass crystal filter, the phase noise contribution can be reduced to about 25 fs, as described by A. Zanchi, et al., "Measurement and Spice Prediction of Sub-Picosecond Clock Jitter in A-to-D Converters," as cited above. Thus, a differential low-noise sinusoidal clock source is now the preferred choice to sample high-speed, high-amplitude input signals.

b) The timing jitter contribution of a single signal inverter is related to the size of its components. The bigger a MOSFET gate, the smaller the jitter due to thermal noise, as described by A. Zanchi, et al., in "A 16-Bit 65 MS/s 3.3 V Pipeline ADC Core in SiGe BiCMOS with 78-dB SNR and 180 fs Jitter," in press for the IEEE Journal of Solid-State Circuits, June 2005, and to the efficacy of decoupling against supply bounce. However, for the technology at hand, an upper bound for the digital inverter timing jitter contribution can be determined by simulation to be about 70 fs.

c) Since the prior art preamplifiers introduce timing jitter ranging from 500 fs down to 180 fs, as described by A. Zanchi, et al., in "A 16-Bit 65 MS/s 3.3 V Pipeline ADC Core in SiGe BiCMOS with 78-dB SNR and 180 fs Jitter", cited above, and given the quadratic nature of jitter addition from multiple (statistically independent) noise sources, i.e., that the variances of independent noise sources add, it is apparent that the preamplifier is the greatest contributor to the timing jitter limitation for the signal-to-noise ratio inside a chip.

Several prior art preamplifier circuits have been presented such as by A. R. Bugeja, et al., in "Design of a 14 b 100 MS/s switched-capacitor Pipelined ADC in RFSiGe BiCMOS," in the Proceedings of the ISCAS 2001, held in Sydney Australia, in May 2001, on pages 428-431, in the datasheet for the LTC 1748 14-bit, 80 MS/s Low Noise ADC, Linear Technology Corp., 2003, page 15, and by A. Zanchi, et al., "A 16-Bit 65 MS/s 3.3 V Pipeline ADC Core in SiGe BiCMOS with 78-dB SNR and 180 fs Jitter," as cited above, and are illustrated in FIGS. 2A, 2B, and 2C, respectively.

Turning to FIG. 2A, illustrated is a clock signal preamplifier circuit of the prior art with resistive passive loads formed with differentially coupled n-channel MOSFETs 206 and 208 that are coupled to a differential sinusoidal input signal. The input signal is coupled to circuit nodes VINP and VINN. The circuit is powered from a bias voltage source coupled to the circuit nodes $V_{DD}$ and $V_{SS}$. N-channel MOSFET 210, in series with MOSFETs 206 and 208, is operated as a current source at a current level of about 6 mA by application of a controlled voltage to its gate terminal on lead 212. The drains of MOSFETs 206 and 208 are coupled to the passive pull-up resistors R1 and R4, and to the drains of p-channel MOSFETs 202 and 204. The gates of MOSFETs 202 and 204 are coupled to the common circuit node of resistors R1 and R4, so that MOSFETs 202 and 204 define the dc level for the outputs of the preamplifier and synthesize, from an ac perspective, a low-impedance differential diode-connected load tied to the $V_{DD}$ circuit node in which 6 mA of current also flow in total. The output voltage from the clock-signal preamplifier, which is a rectangular waveform signal, can either be supplied differentially on circuit nodes VINTP and VINTN, i.e., the output voltage is one circuit node voltage minus the other, or as in the present embodiment, can be supplied as a single-ended signal to separate inverters (as illustrated in FIG. 1). In the differential case, the voltage gain of the circuit is the transconductance of one input MOSFET, i.e., MOSFET 206 or 208, times the resistance of R1 or R4, which are assumed to be equal. The transition speed of the output voltage of this circuit at the transition times of the rectangular waveform, which is related to its output timing jitter, is limited by the passive pull-up arrangement of the resistors R1 and R4 and parasitic circuit capacitance, and these circuit elements contribute to limiting the ultimate timing performance of the circuit due to the limited slope of the voltage transitions. The same principle applies to resistance-loaded preamplifier topologies which do not make use of P-type devices used as diodes in parallel with the resistors.

An improved version of the clock-signal preamplifier circuit illustrated in FIG. 2A is the prior-art clock signal preamplifier circuit using PMOS active loads illustrated in FIG. 2B. Again, this circuit is formed with a pair of differentially connected n-channel MOSFETs, 226 and 228, that are coupled to the input signals, VINP and VINN. The circuit is powered from a bias voltage source coupled to the circuit nodes $V_{DD}$ and $V_{SS}$. A 6 mA current source is provided by the n-channel MOSFET 230, controlled by a voltage applied to its gate terminal on lead 232. The loads for the differentially connected MOSFETs 226 and 228 are formed with p-channel MOSFETs 222 and 224, controlled by a voltage applied to their gate leads, 234. The MOSFETs 222 and 224 provide a much higher impedance for the drains of MOSFETs 226 and 228 than the resistors R1 and R4 shown in FIG. 2A. Nonetheless, the differential output voltage on circuit nodes VINTP and VINTN is still driven by passive loads such as formed with MOSFETs 222 and 224 and loaded with inherent circuit parasitic capacitance. The voltage gain of the circuit is the transconductance of one input MOSFET, i.e., MOSFET 226 or 228, times the parallel drain resistance of MOSFETs 224 and 228 or MOSFETs 222 and 226. Thus, the output impedance of the circuit is higher than the circuit illustrated in FIG. 2A. The transition speed of the output voltage of this circuit and its timing jitter are again limited by the passive pull-up arrangement of the MOSFETs 222 and 224 and the circuit parasitic capacitance. Although the gain of this circuit is higher than the gain of the circuit illustrated in FIG. 2A, its noise is also higher, resulting in little or no improvement in its timing jitter.

A third version from the prior art of a clock-signal preamplifier circuit using a PMOS pseudo-latch which provides positive feedback during the voltage transition of the output clock signal is illustrated in FIG. 2C. The circuit is formed with a pair of differentially connected n-channel MOSFETs 246 and 248 that are coupled to the input signals on circuit nodes VINP and VINN. A 6 mA current source is provided by the n-channel MOSFET 250, controlled by a voltage applied to its gate terminal on lead 252. The circuit is powered from a bias voltage source coupled to the circuit nodes $V_{DD}$ and $V_{SS}$. In this circuit, the slope of the pull-up edge of the single-ended output voltages at nodes VINTP and VINTN is increased by the inclusion of cross-coupled MOSFETs 242 and 244, which improves the total jitter of the clock-signal rectangular waveform output signal by about 50%. Nonetheless, MOSFETs 242 and 244 provide limited switching speed at the pull-down transitions of the rectangular waveform outputs, which still limits the timing jitter that can be produced by such a circuit. In particular, at lower sampling frequencies the inherent hysteresis built into the circuit adversely impacts the jitter performance of this solution, making it worse than the aforementioned prior art for rates of 30MS/s or lower in the present technology.

The main limitations of the prior art circuits are thus passive pull-up of the output, which results in slow transition times, making them more sensitive to timing uncertainties, and forced usage of MOSFET devices to yield larger output swings, which generally results in reduced output voltage transition slopes and higher device noise (e.g., a 1/f-dependent noise component), in turn requiring additional buffer stages which introduce more sources of jitter, as described by A. Zanchi, et al., in "A 16-Bit 65 MS/s 3.3 V Pipeline ADC Core in SiGe BiCMOS with 78-dB SNR and 180 fs Jitter", cited above, and by J. A. McNeill, "Jitter in Ring Oscillators," published in the IEEE Journal of Solid-State Circuits, Vol. 32, No. 6, June 1997, on pages 870-879.

Thus, the prior art approach uses passive pull-up circuits and/or cross-coupled transistors in the clock-signal preamplifier to produce a rectangular clock output waveform. Despite the advances in clock-signal preamplifiers, a remaining obstacle to obtaining low timing jitter in the conversion of a sinusoidal timing reference signal to an amplified and rectangular waveform signal is the need to increase the slope of the output voltage waveform at its voltage transition points so that the preamplifier introduces less timing signal jitter in the generation of a rectangular output waveform.

A need thus exists for a clock-signal preamplifier that can amplify a sinusoidal timing reference signal, convert it to a rectangular waveform, and produce output voltage transitions with increased slope, resulting in less timing jitter of the output voltage waveform than is achieved by the prior art.

SUMMARY OF THE INVENTION

Embodiments of the present invention achieve technical advantages as a clock-signal preamplifier with low timing jitter in the output signal. The input signal to the preamplifier is typically a sinusoidal waveform, and the output signal is a rectangular waveform. In a preferred embodiment, the clock-signal preamplifier comprises complementary pairs of differentially coupled transistors, and terminals of the differentially coupled transistors are clamped with a pair of diode clamper circuits. In a preferred embodiment, the differentially coupled transistors are bipolar transistors and their collector terminals are clamped with the pair of diode clamper circuits. In a further embodiment, the differentially coupled transistors are MOSFET transistors. The output signal from the preamplifier is preferably coupled to an inverter comprising a totem-pole arrangement of complementary MOSFET transistors. Preferably, the diode clamper circuits comprise bipolar transistors coupled to the complementary pairs of differentially coupled transistors. A reference voltage source is coupled to the control terminals of the clamper transistors. The reference voltage source, which provides a reference voltage for the diode clamper circuits, preferably comprises a totem-pole arrangement of complementary MOSFET transistors with its output node coupled to its input node. Preferably, MOSFET transistors of the reference voltage source and MOSFET transistors of like kind of the inverter are configured to have substantially identical threshold voltages. In a preferred embodiment, the reference voltage produced by the reference voltage source is by-passed to a quiet voltage node in the circuit such as circuit ground or a bias voltage node.

In accordance with another preferred embodiment of the present invention, a digital signal processing system comprises a clock-signal preamplifier with low output signal timing jitter. The input signal to the preamplifier is typically a sinusoidal waveform, and the output signal is a rectangular waveform. In a preferred embodiment, the clock-signal preamplifier comprises complementary pairs of differentially coupled transistors, and terminals of the differentially coupled transistors are clamped with a pair of diode clamper circuits. Preferably, the differentially coupled transistors are bipolar transistors and their collector terminals are clamped with the pair of diode clamper circuits. In a further embodiment, the differentially coupled transistors are MOSFET transistors. The output signal from the preamplifier is preferably coupled to an inverter comprising a totem-pole arrangement of complementary MOSFET transistors. Preferably, the diode clamper circuits comprise bipolar transistors coupled to the complementary pairs of differentially coupled transistors. A reference voltage source is coupled to the control terminals of the clamper transistors. The reference voltage source, which provides a reference voltage for the diode clamper circuits, preferably comprises a totem-pole arrangement of complementary MOSFET transistors with its output node coupled to its input node. Preferably, MOSFET transistors of the reference voltage source and MOSFET transistors of like kind of the inverter are configured to have substantially identical threshold voltages. In a preferred embodiment, the reference voltage produced by the reference voltage source is by-passed to a quiet voltage node in the circuit such as circuit ground or a bias voltage node.

Another embodiment of the present invention is a method of configuring a clock-signal preamplifier to convert an input signal to an output signal with a rectangular waveform with low timing jitter. Preferably, the method includes coupling a sinusoidal input signal waveform to the input of the preamplifier. The method further includes comprising the clock-signal preamplifier with complementary pairs of differentially coupled transistors, and clamping the terminals of the differentially coupled transistors with a pair of diode clamper circuits. Preferably, the method includes using bipolar transistors for the differentially coupled transistors and clamping their collector terminals with the pair of diode clamper circuits. In a further embodiment, the method includes using MOSFET transistors for the differentially coupled transistors. In a preferred embodiment, the method includes coupling the output signal from the preamplifier to an inverter comprising a totem-pole arrangement of complementary MOSFET transistors. Preferably, the method includes comprising the diode clamper circuits with bipolar transistors and coupling the diode clamper circuits to the complementary pairs of differentially coupled transistors. The method preferably includes coupling a reference voltage source to the control terminals of the clamper transistors. In a preferred embodiment, the method includes comprising the reference voltage source, which provides a reference voltage for the diode clamper circuits, with a totem-pole arrangement of complementary MOSFET transistors, and coupling the output node of the totem-pole to its input node. In a preferred embodiment, the method includes using MOSFET transistors in the reference voltage source with substantially identical threshold voltages as MOSFET transistors of like kind in the inverter. In a preferred embodiment, the method includes by-passing the reference voltage produced by the reference voltage source to a quiet voltage node in the circuit such as circuit ground or a bias voltage node.

The invention solves the preamplifier jitter problem by making use of a bipolar complementary circuit wherein two differential pairs are constantly active and driven out of phase. The required phase splitter circuitry is implemented with a low-noise all-passive RC network which shifts and reverts the phases as needed. To prevent saturation of the active devices, a basic diode clamp network limits the swing on the collectors around the trip point of the cascaded inverter trailing the preamplifier, still allowing for the ensuing regenerative CMOS inversion out of the clamped voltage swing.

Embodiments of the present invention achieve technical advantages as a clock-signal preamplifier that converts a sinusoidal reference waveform into a rectangular waveform with very rapid waveform transitions. Advantages of embodiments of the present invention include a clock-signal preamplifier with very little added timing jitter above that contributed by the input reference waveform.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a clock signal preamplifier comprising two complementary pairs of differentially coupled transistors, coupled in series between the circuit nodes of a bias voltage source, that produces a rectangular output waveform with very fast voltage transitions from a sinusoidal input voltage, and with very little timing jitter. The clock signal preamplifier preferably comprises bipolar devices and includes diode clampers comprising a totem-pole arrangement of bipolar transistors. The diode clampers are coupled to the collectors of the pairs of differentially coupled transistors to provide upper and lower voltage limits for the collector voltages, thereby preventing saturation of the differentially coupled transistors. The base terminals of the bipolar transistors in the diode clampers are coupled to a replica bias voltage source that replicates, in this embodiment, the threshold voltage of inverters coupled to the output of the clock signal preamplifier to provide a well controlled voltage in the circuit for the output voltage switching transitions.

Alternative embodiments include a clock signal preamplifier comprising complementary pairs of differentially coupled CMOS transistors with diode clampers for the drains of the CMOS transistors optionally included in the circuit. When the diode clampers are omitted, replica bias voltage sources that replicate the threshold voltage of inverters coupled to the output of the clock signal preamplifier are also unnecessary.

Figure 3:
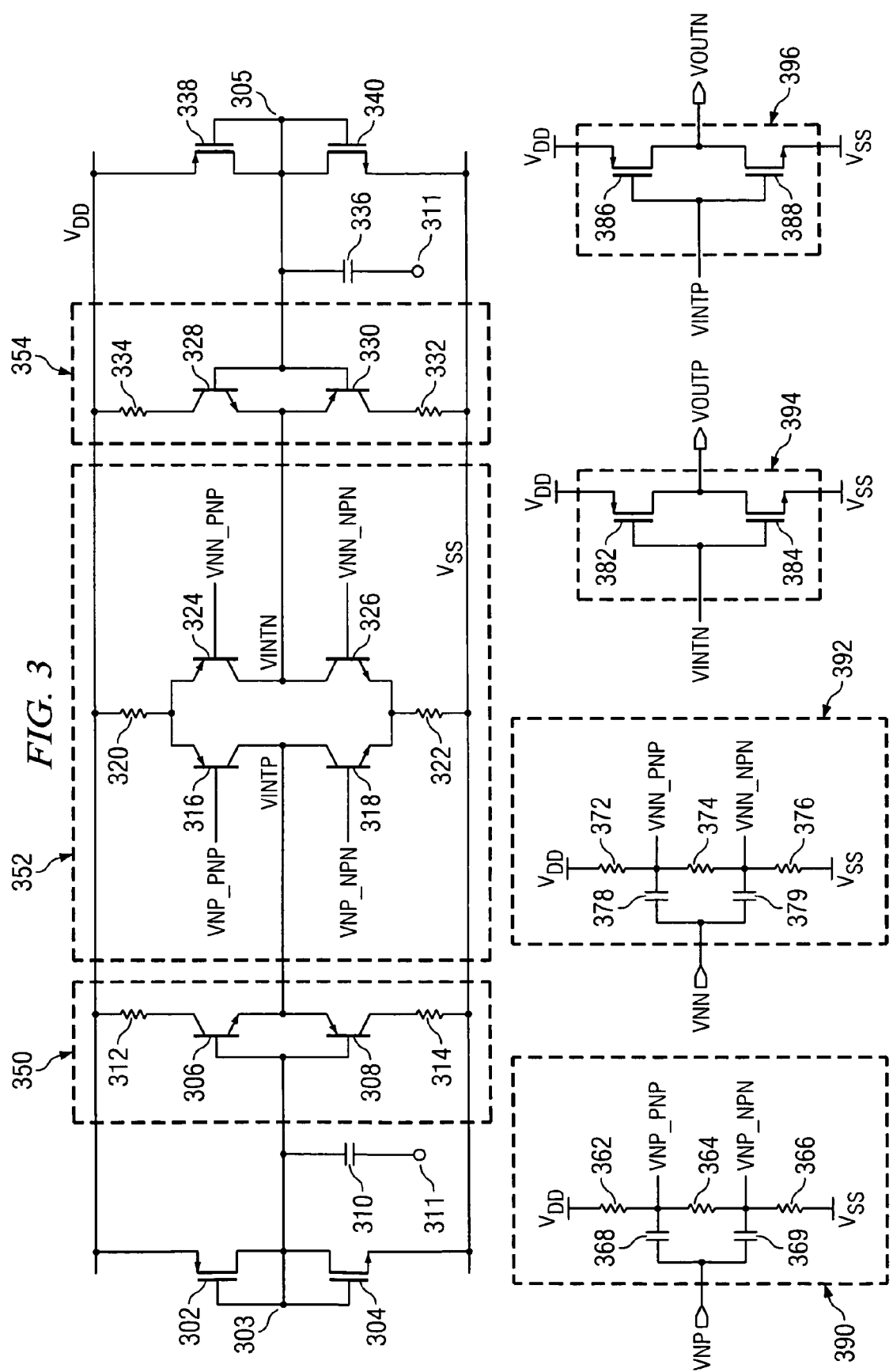
FIG. 3 illustrates a diode-clamped, bipolar, clock signal preamplifier circuit of the present invention.

With reference to FIG. 3, illustrated is a clock-signal preamplifier of the present invention using complementary pairs of differentially coupled bipolar transistors. The circuit illustrated in FIG. 3 produces very rapid voltage transitions for the output clock signal and reduces preamplifier jitter by using a bipolar complementary circuit, wherein two differential bipolar transistor pairs, transistors 316 and 324 and transistors 318 and 326, forming the complementary pairs of differentially coupled transistors 352, are constantly in the active region, i.e., they are not driven into saturation, and are driven out of phase by a differential sinusoidal input voltage signal. Input phase-splitter circuitry is included in the circuit arrangement and is implemented with low-noise, passive, RC networks that level-shift the differential input signal phases as needed with a low-noise circuit arrangement. To prevent saturation of the active signal-amplifying devices, i.e., transistors 316, 318, 324, and 326, diode clampers 350 and 354 limit the collector voltage swing around the trip point of the cascaded inverters driven by the preamplifier, allowing for the ensuing regenerative CMOS inversion of the clamped voltage swing.

A differential sinusoidal input signal is coupled, as illustrated in FIG. 3, to circuit nodes VNP and VNN of the passive phase splitters 390 and 392. The phase splitters comprise resistor dividers, such as the resistor divider comprising resistors 362, 364 and 366, and the resistor divider comprising resistors 372, 374, and 376. The resistor dividers are coupled to a bias voltage source at the circuit nodes $V_{DD}$ and $V_{SS}$. The bias voltage source provides +2.7 V and −2.7 V at the circuit nodes $V_{DD}$ and $V_{SS}$, but other bias voltages are well within the broad scope of the present invention. Capacitors 368, 369, 378, and 379 provide dc voltage isolation of the input circuit nodes, VNP and VNN, and are ac-coupled to drive a first differential input pair of preamplifier transistors, 316 and 324, and a second, complementary, differential input pair of preamplifier transistors, 318 and 326. The resistors in the resistor dividers are selected to provide proper bias voltages for the bases (or the gates, in a CMOS implementation) of the two complementary pairs of differential input, preamplifier transistors. Thus, an essential function of the passive phase splitters is to level-shift the differential sinusoidal input voltage signal and to bias the differential transistors of the preamplifier while feeding the proper phase derived from the input sinusoid to each of the devices 316, 318, 324, and 326.

Diode clampers 350 and 354 formed with n-channel transistors 306 and 328 and p-channel transistors 308 and 330 establish stiff voltage clamping limits for the collectors of the two complementary pairs of differential input, preamplifier transistors comprising bipolar transistors 316, 324, 318, and 326. The reference voltage for the diode clampers is preferably set at the trip voltage of inverter loads driven by the preamplifier, and is set by replica bias circuits, as described below, coupled to the base terminals of the diode clamper transistors. Alternatively, an external bias circuit with a low output impedance can be used to set the reference voltage for the diode clampers. The diode clampers comprise a totem-pole arrangement of an npn and a pnp transistor coupled between the bias voltage circuit nodes $V_{DD}$ and $V_{SS}$. Resistors, 312 and 314, and 332 and 334 are optionally included in series with the diode clampers to limit current spikes during the voltage transitions of the output clock voltage signal.

The replica bias circuits, such as the replica bias circuit comprising a totem-pole arrangement of the p-channel MOSFET 302 and the n-channel MOSFET 304, and the totem-pole arrangement of the p-channel MOSFET 338 and the n-channel MOSFET 340, replicate inverter loads driven by the preamplifier. The totem poles are arranged with their outputs coupled to their inputs, which produces a voltage at the threshold voltage of the MOSFETs on circuit nodes 303 and 305. These voltages set the base voltage of the bipolar transistors in the diode clampers 350 and 354. The voltages on circuit nodes 303 and 305 are each by-passed for improved timing jitter performance with a capacitor to a quiet, steady, voltage source by the capacitors 310 and 336, which are coupled to a quiet noise point of the circuit, circuit node 311. A quiet noise point of the circuit is a circuit node such as circuit ground or a bias voltage source circuit node such as the circuit nodes $V_{SS}$ or $V_{DD}$ illustrated in the figure.

Resistors 320 and 322 in series with the two complementary pairs of differential input transistor of the preamplifier act as current sources and supply an average current of about 1 mA. Of course, other current levels are well within the broad scope of the present invention. These resistors are shown coupling the differential input transistor pairs to the bias voltage sources $V_{DD}$ and $V_{SS}$. Alternatively, these resistors can be replaced within the broad scope of the present invention with active current sources such as with bipolar transistors, or by appropriate selection and biasing of NMOS and PMOS transistors as current sources, as is well known in the art. Resistors are the preferred implementation of these current sources for their low noise characteristics.

The output voltage from the preamplifier in the circuit as illustrated in FIG. 3 is supplied as a single-ended voltage to the circuit nodes VINTP and VINTN, and is a generally rectangular waveform voltage, roughly symmetric about 0 volts, with very fast voltage transitions at the voltage switching points of the waveforms.

The inverter loads, 394 and 396, for the preamplifier comprise a first totem-pole arrangement of p-channel MOSFET 382 and n-channel MOSFET 384, and a second totem-pole arrangement of p-channel MOSFET 386 and n-channel MOSFET 388. The inverter loads are coupled to the bias voltage source at circuit nodes $V_{DD}$ and $V_{SS}$. The trip voltage of these inverters matches the replica bias voltage as described above by matching of the respective transistors. The inverters are driven by the output signals VINTP and VINTN from the preamplifier, and produce inverted single-ended rectangular waveform output signals at the circuit nodes VOUTP and VOUTN.

Figure 3A:
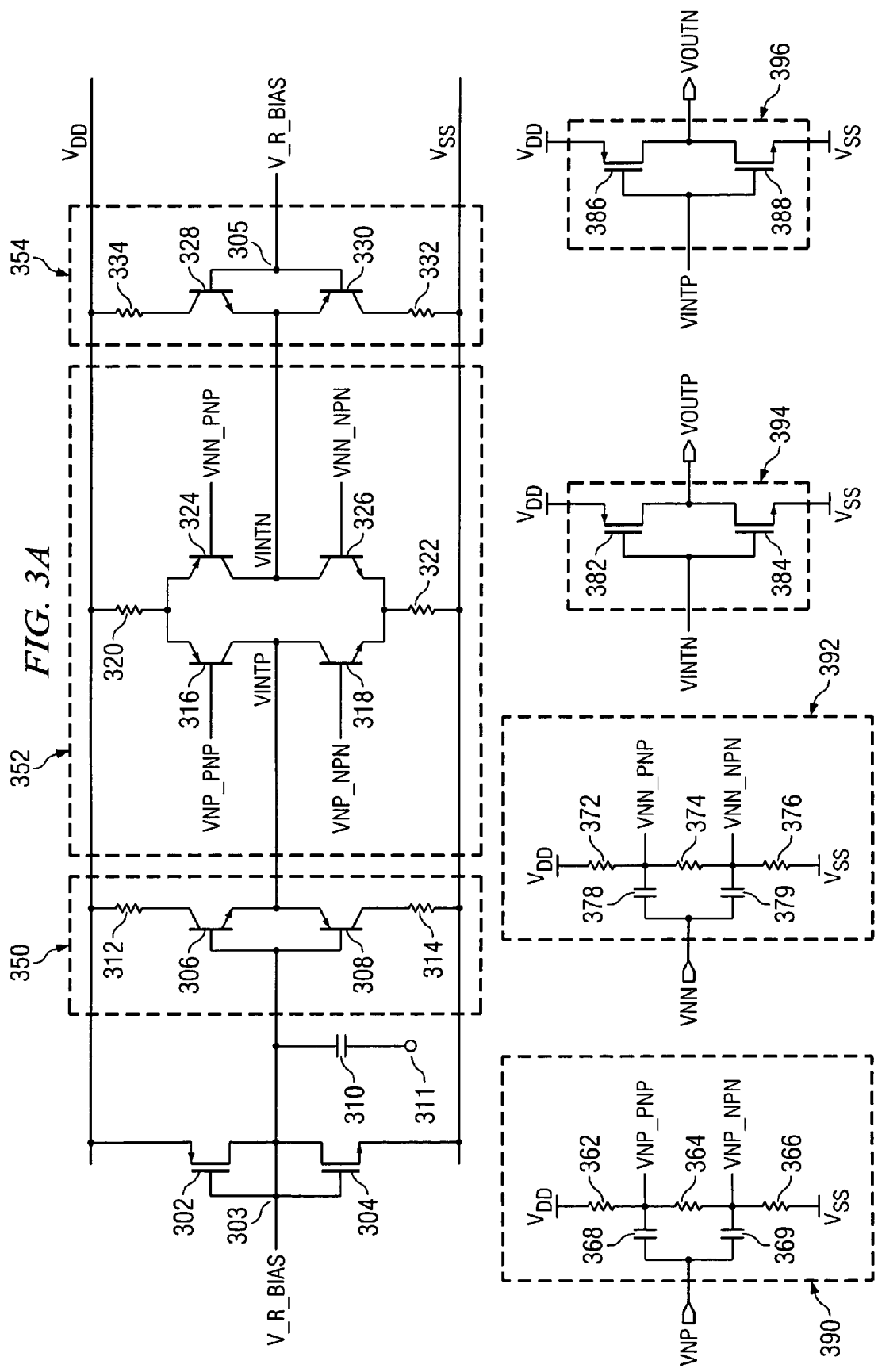
FIG. 3A illustrates another embodiment of a diode-clamped, bipolar, clock signal preamplifier circuit of the present invention.

Turning next to FIG. 3A illustrated is a clock-signal preamplifier of the present invention using complementary pairs of differentially coupled bipolar transistors. This circuit is similar to the circuit illustrated in FIG. 3, but includes only one replica bias voltage source. The transistors 338 and 340 and the by-pass capacitor 336 as illustrated in FIG. 3 are omitted in FIG. 3A. The circuit node 305 in FIG. 3A producing the voltage V_R_BIAS is now coupled to circuit node 303, which sets the reference voltage for both diode clampers. The remaining elements of the circuit operate in a manner similar to the elements of the circuit illustrated in FIG. 3 and will not be re-described.

Figure 1:
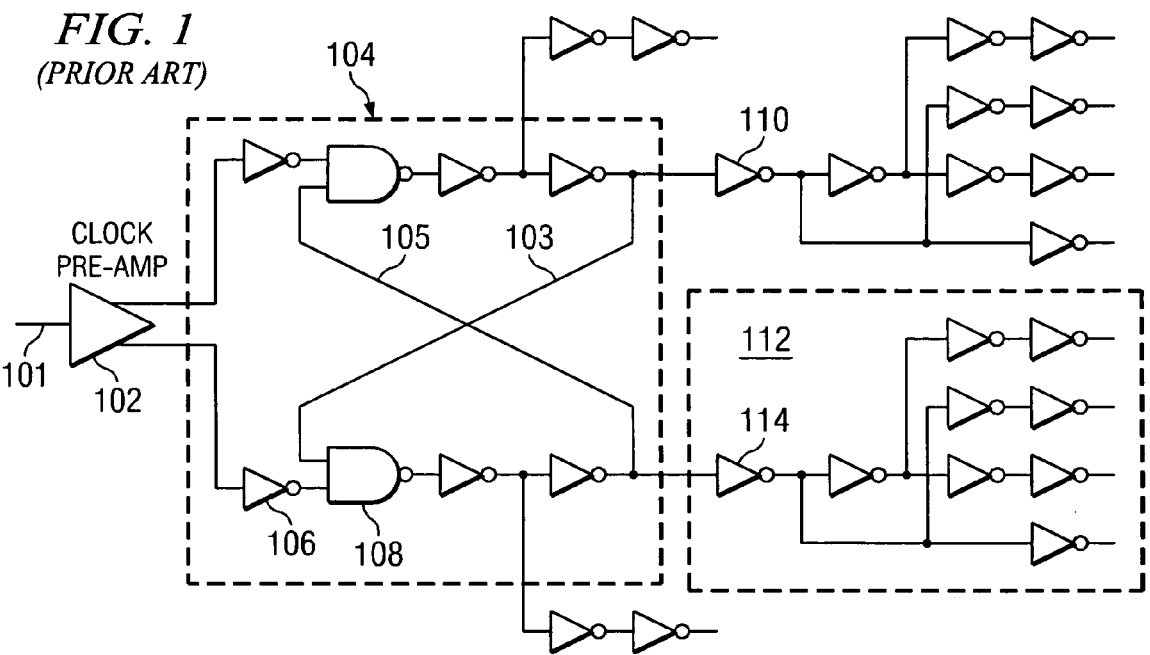
FIG. 1 illustrates a typical clock circuit illustrating the sampling phase path and the preamplifier outputs.
Figure 2A:
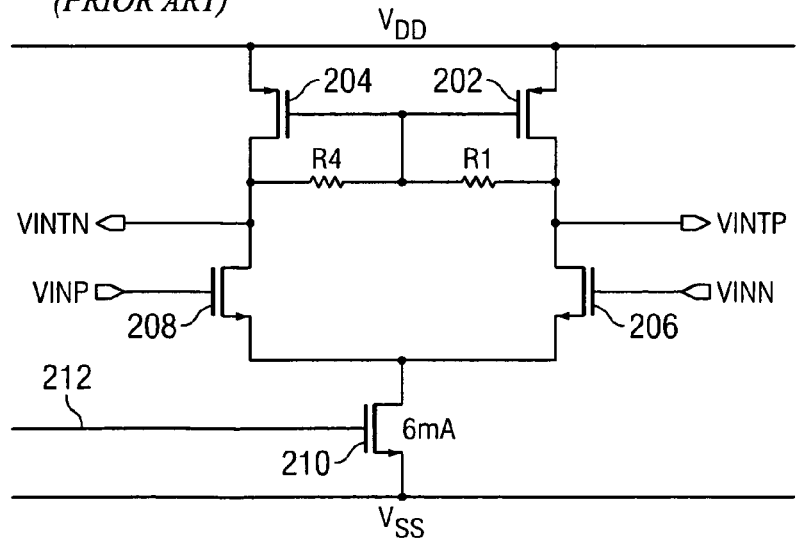
FIGS. 2A, 2B, and 2C illustrate preamplifier circuits of the prior art.
Figure 2B:
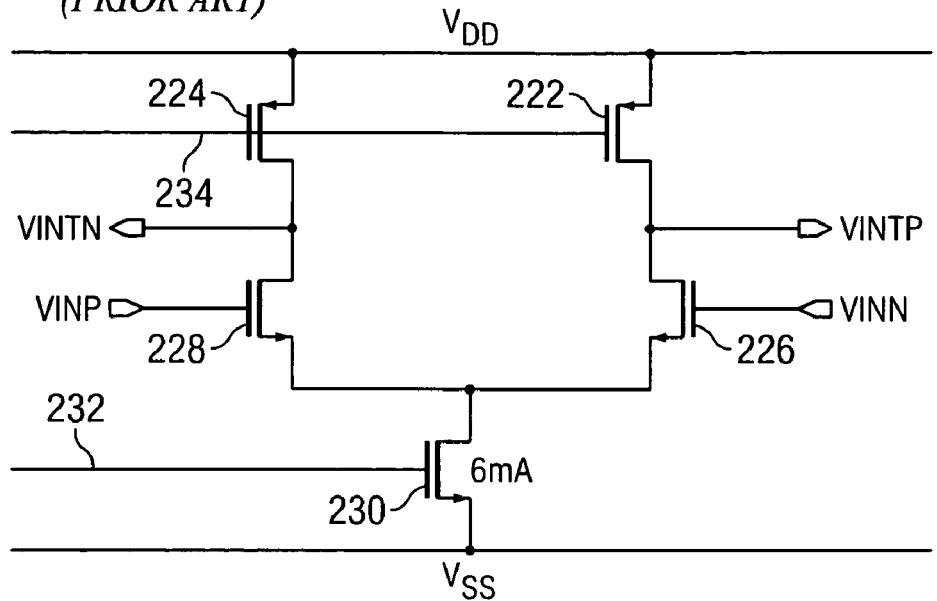
Figure 4A:
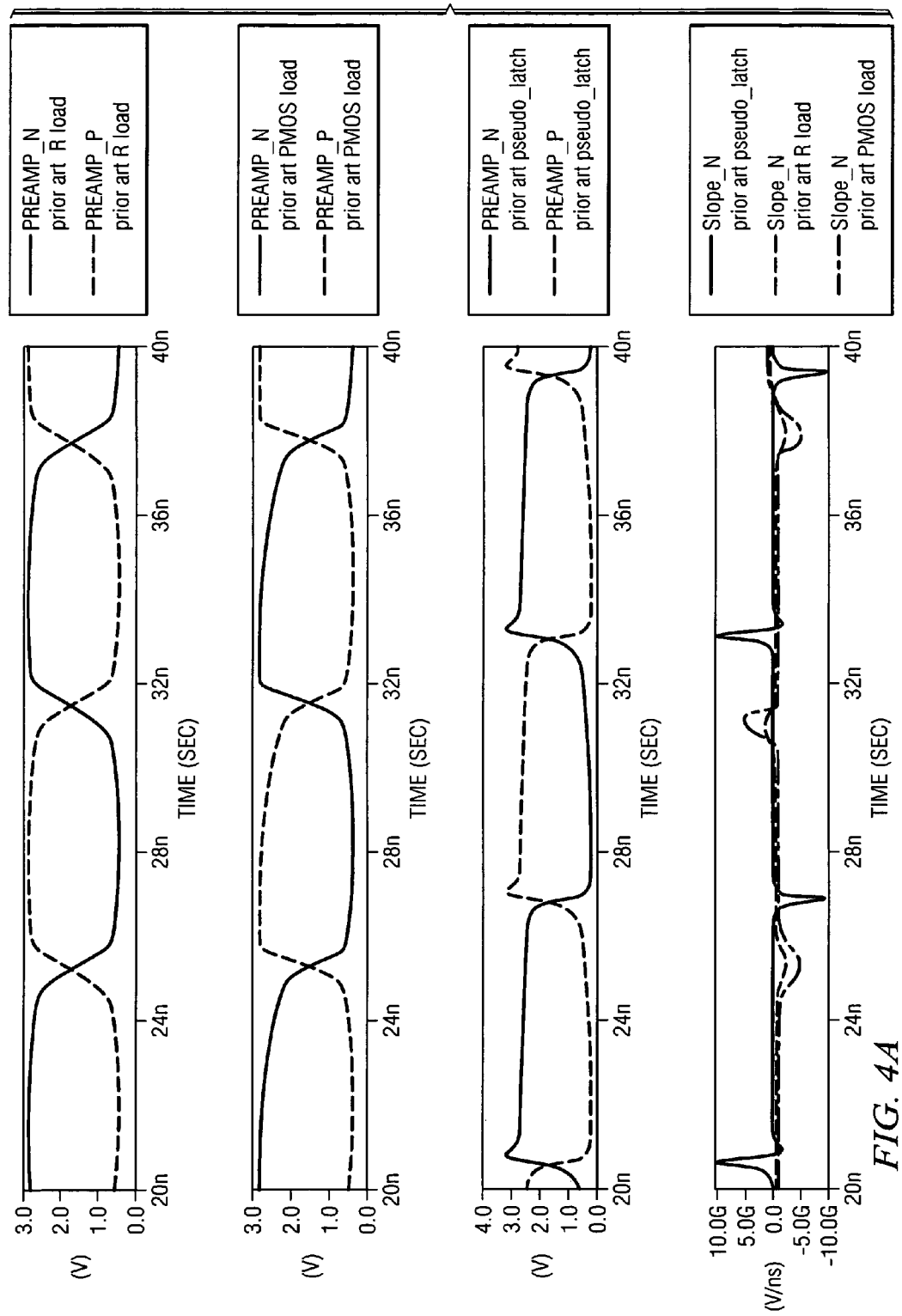
FIG. 4A shows simulation results for preamplifier circuits of the prior art.

FIG. 4A illustrates results of simulating clock-signal preamplifier circuits of the prior art. The top graph shows the output voltage signal (the voltages at the differential pair of output circuit nodes) for a preamplifier circuit similar to the circuit illustrated in FIG. 2A arranged with resistor loads. The second graph shows the output voltage signal for a preamplifier circuit similar to the circuit illustrated in FIG. 2B arranged with PMOS transistor loads. The third graph shows the output voltage signal for a preamplifier circuit similar to the circuit illustrated in FIG. 2C arranged with cross-coupled PMOS transistor loads. The bottom graph shows the slope of the output voltage signal for preamplifier circuits corresponding to the previous three graphs of this figure.

Figure 4B:
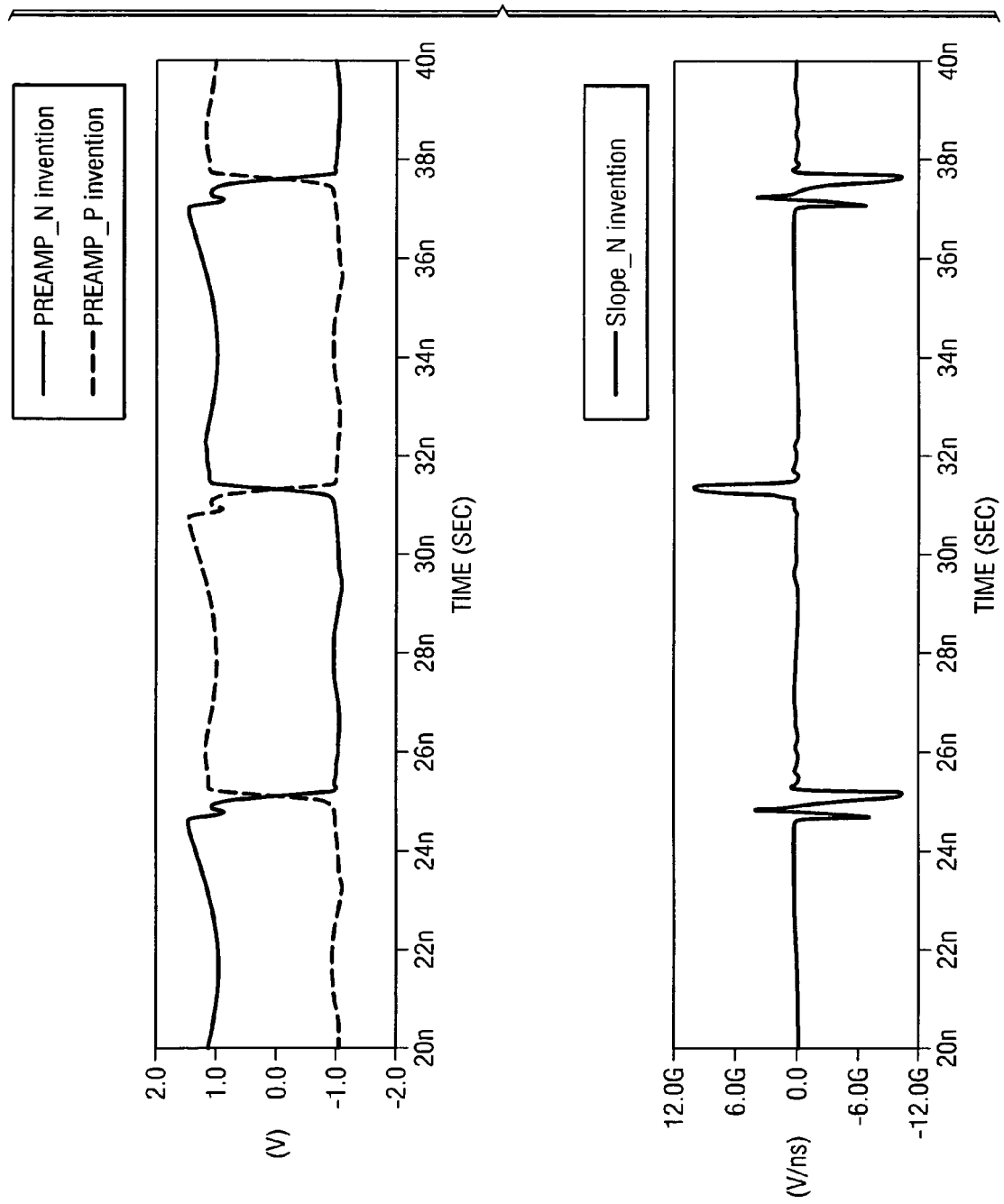
FIG. 4B shows simulation results for a bipolar clock signal preamplifier circuit of the present invention.

FIG. 4B illustrates results of simulating a clock-signal preamplifier circuit of the present invention comprising complementary pairs of differentially coupled bipolar transistors with diode clampers, similar to the circuit illustrated in FIG. 3. The output voltage signal is clamped at approximately ±1 volt by the diode clamper, and exhibits very rapid voltage swings at the voltage transition points. The top graph shows the output voltage signal, i.e., the voltages at the circuit nodes VINTP and VINTN, the output of the preamplifier as depicted in FIG. 3, and the bottom graph shows the slope of the voltage signal VINTN.

Figure 2C:
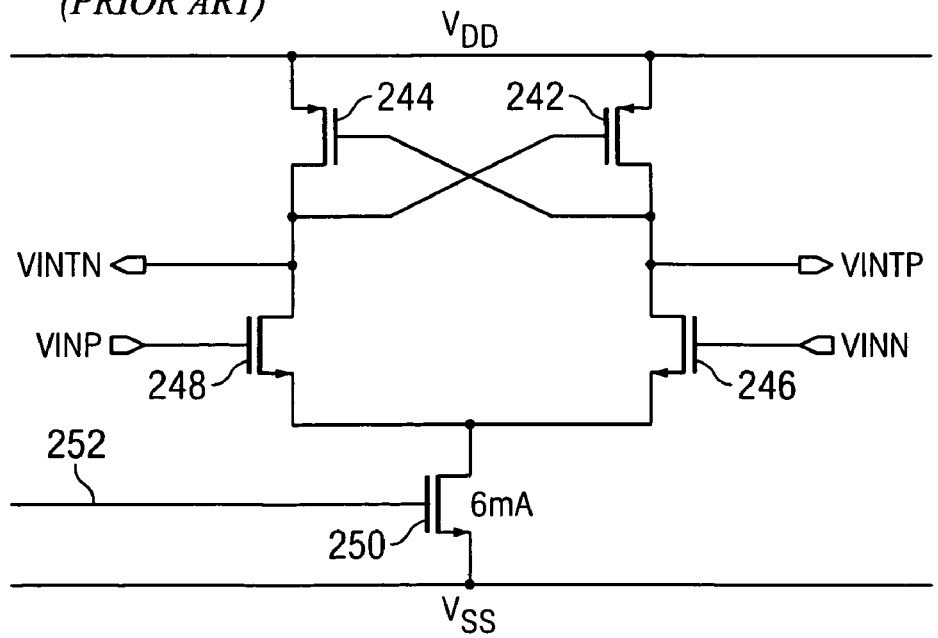
Figure 5A:
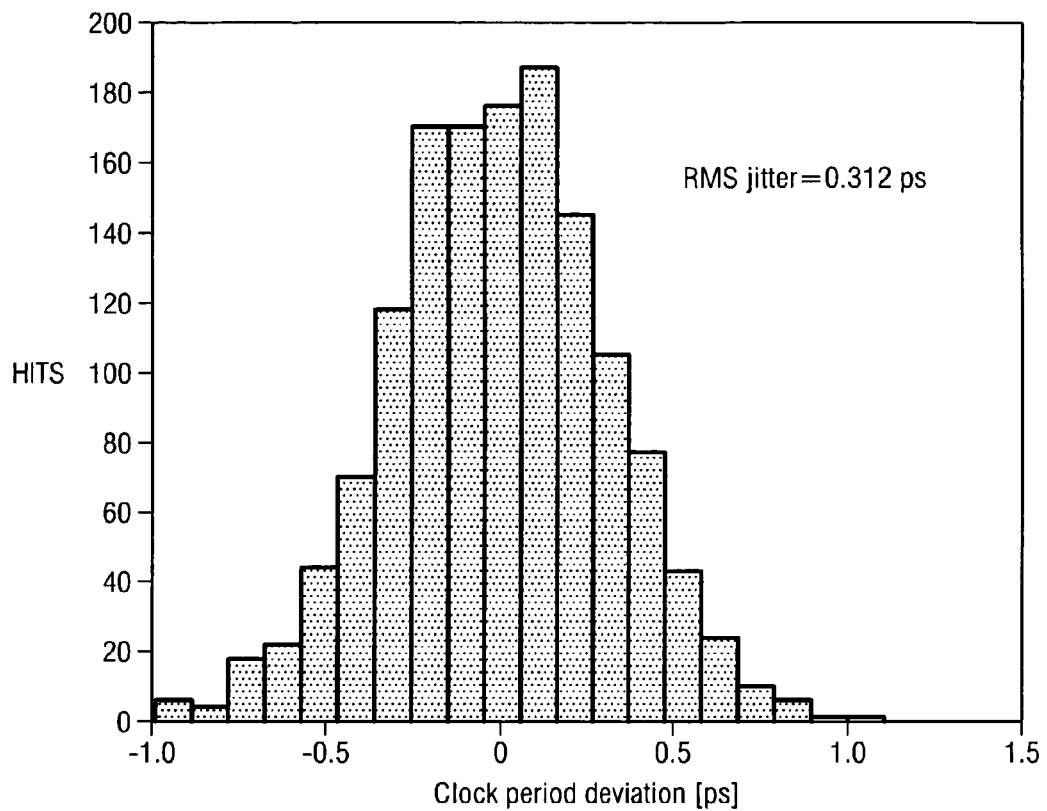
FIG. 5A shows simulation results for the distribution of clock period deviation for a preamplifier circuit of the prior art.

FIG. 5A illustrates the Gaussian distribution of the clock period obtained by Spice transient noise simulation of the prior-art cross-coupled preamplifier of FIG. 2C, operated from a ±2.7 V bias source. The method of simulation is described by A. Zanchi, et al., in the paper titled "Measurement and Spice Prediction of Sub-Picosecond Clock Jitter in A-to-D Converters," cited hereinabove. The data, showing an rms jitter of 312 fs, illustrate the timing aperture uncertainty achievable with this circuit, which is better than the circuit configurations illustrated in FIGS. 2A and 2B. The input sinusoid had 2 volts amplitude and the circuit was operated at 100 MHz.

Figure 5B:
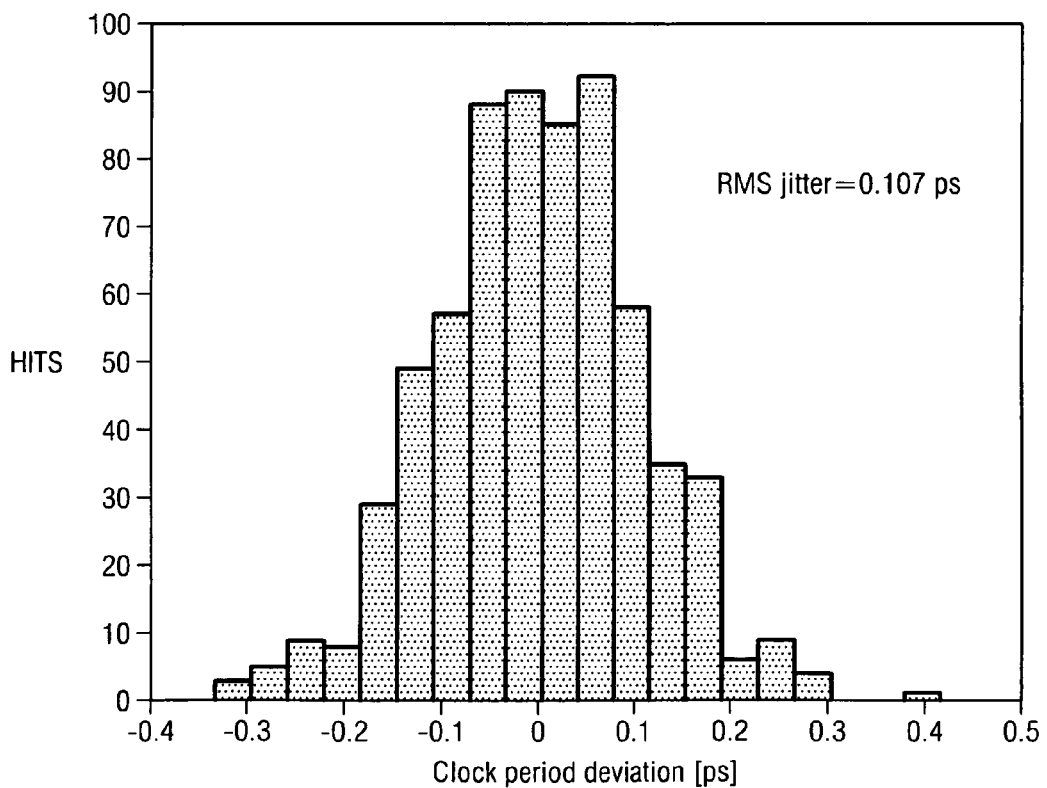
FIG. 5B shows simulation results for the distribution of clock period deviation for a bipolar preamplifier circuit of the present invention.

FIG. 5B illustrates the Gaussian distribution of the clock period obtained by Spice transient noise simulation of the clock-signal preamplifier circuit of the present invention. This circuit includes diode clampers and is operated from a ±2.7 V bias source; this circuit corresponds to the circuit of the present invention illustrated in FIG. 3. The data show an rms jitter of only 107 fs, illustrating the very narrow timing aperture uncertainty achievable with this circuit.

The usage of bipolar transistors does not per se provide the timing improvement observed with the present invention. A simulation run of a circuit of the prior art with an npn differential pair and an active pnp load used as a current source yields as much as 515 fs as opposed to the 107 fs observed for the circuit of the present invention. Circuit variations of the present invention, such as substituting npn and pnp current sources for the resistors such as 320 and 322 in FIG. 3, omitting the current limiting resistors such as resistors 312 and 314 in FIG. 3 in series with the diode clampers, or using alternative circuit arrangements for the replica bias reference voltage to set the clamping voltage to which the diodes are referenced, only slightly affect the timing jitter as observed at the output of the preamplifier (e.g., from 107 fs to about 118 fs) and provide a further slight, optional variant to the present invention. More substantial degradation (to as much as 233 fs) is observed when the ballasting capacitor used to filter the voltage referenced by the diode clampers is eliminated, making it a highly desirable though nonessential feature to be incorporated in the embodiment of the idea as disclosed. A 5 to 10 pF capacitor brings the simulated jitter within a few femtoseconds from the optimum value.

Figure 6:
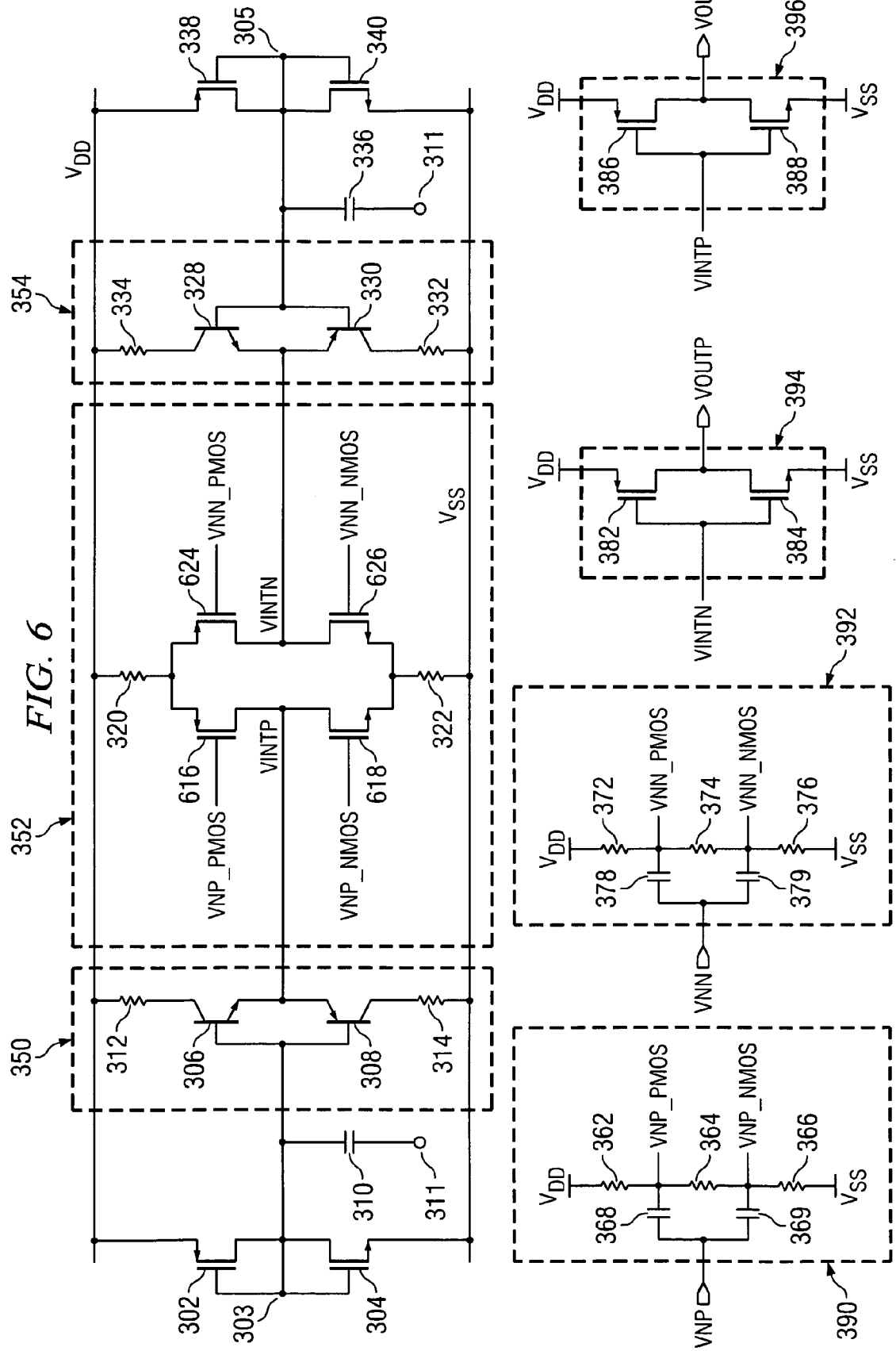
FIG. 6 illustrates a diode-clamped, CMOS clock signal preamplifier circuit of the present invention.

Turning now to FIG. 6, illustrated is a further embodiment of a clock-signal preamplifier of the present invention using complementary pairs of differentially coupled CMOS transistors. The topology of this circuit is similar to the structure of the circuit illustrated in FIG. 3 with the substitution of CMOS transistors for the bipolar transistors in the preamplifier described hereinabove. In particular, PMOS transistors 616 and 624 are coupled in a differential circuit arrangement to the differential input signal at circuit nodes VNP_PMOS and VNN_PMOS, and NMOS transistors 618 and 626 are coupled in a differential circuit arrangement to the differential input signal at circuit nodes VNP_NMOS and VNN_NMOS. The drains of the CMOS transistors are clamped by the diode clampers coupled to circuit nodes VINTP and VINTN. The remaining circuit elements are similar to the circuit elements in FIG. 3 and will not be re-described.

Figure 6A:
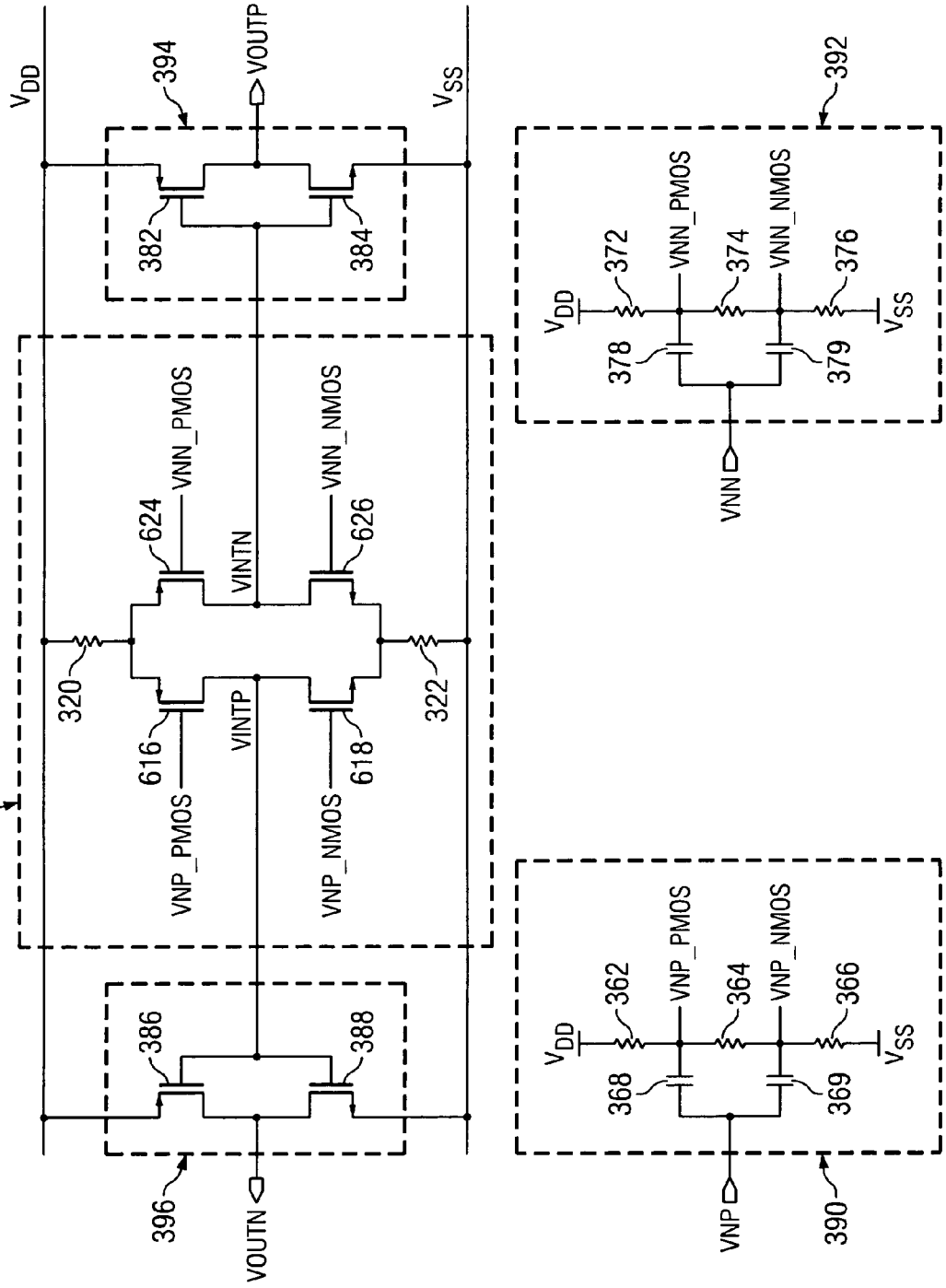
FIG. 6A illustrates a CMOS clock signal preamplifier circuit of the present invention without diode clampers.

FIG. 6A, illustrates a further clock-signal preamplifier of the present invention using complementary pairs of differentially coupled CMOS transistors. This circuit is similar to the circuit described above with reference to FIG. 6, but omits the diode clampers (diode clampers 350 and 354 as illustrated in FIG. 3) and the replica voltage references that set the diode clamper base voltages. The remaining circuit elements are similar to the circuit elements in FIG. 3 and will not be re-described. The omission of diode clampers recognizes the absence of a channel saturation effect in MOSFETs corresponding to base saturation in bipolar transistors, but requires a more careful assessment of device voltage ratings in view of the bias supply voltage applied to the circuit. The omission of the diode clampers may require the use of higher voltage rated parts for circuit reliability, such as 5-volt CMOS transistors when operating from a ±2.7-volt bias source rather than 3.3-volt devices.

Figure 7:
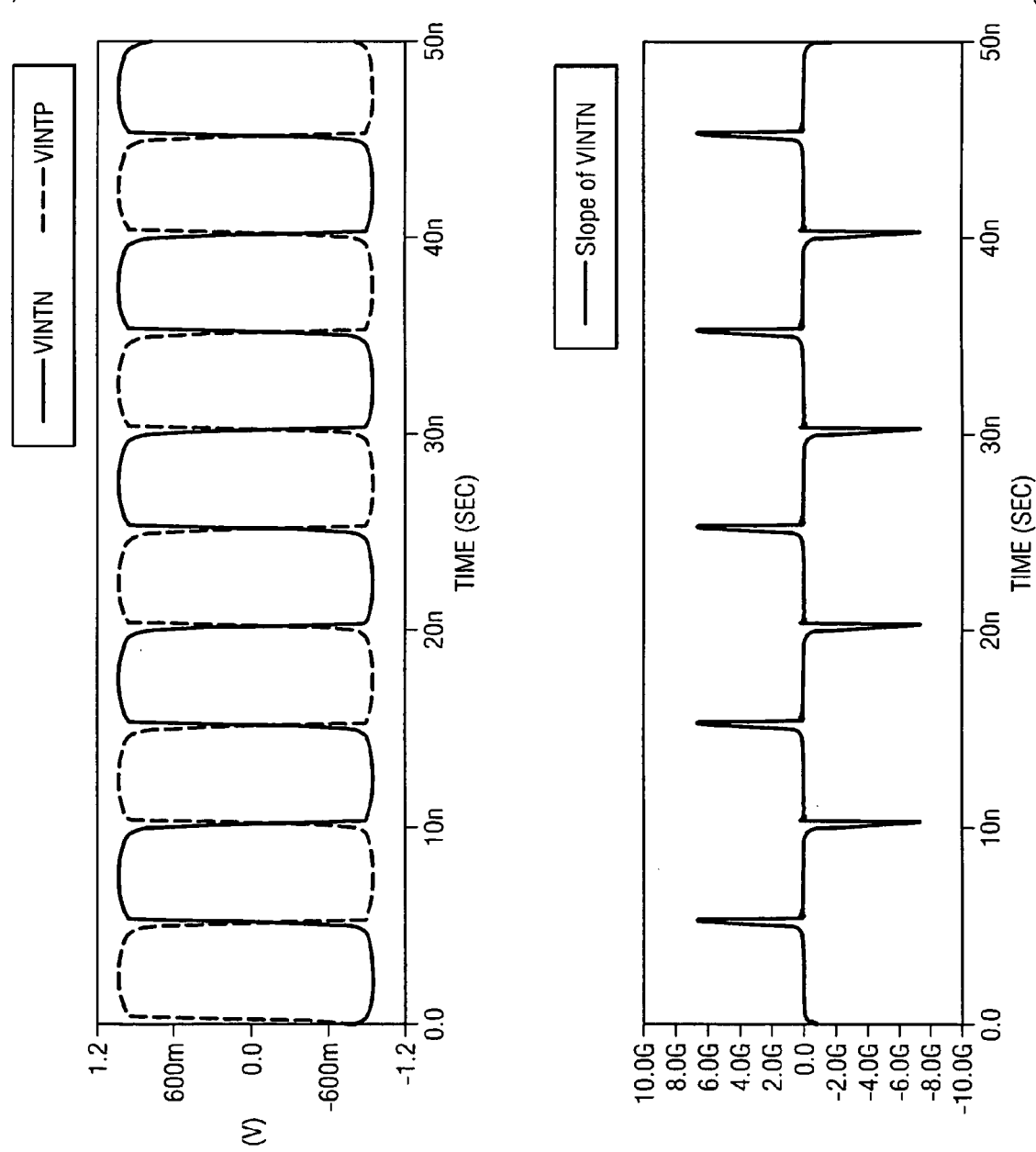
FIG. 7 shows simulation results for a CMOS clock signal preamplifier circuit of the present invention with diode clampers.
Figure 8:
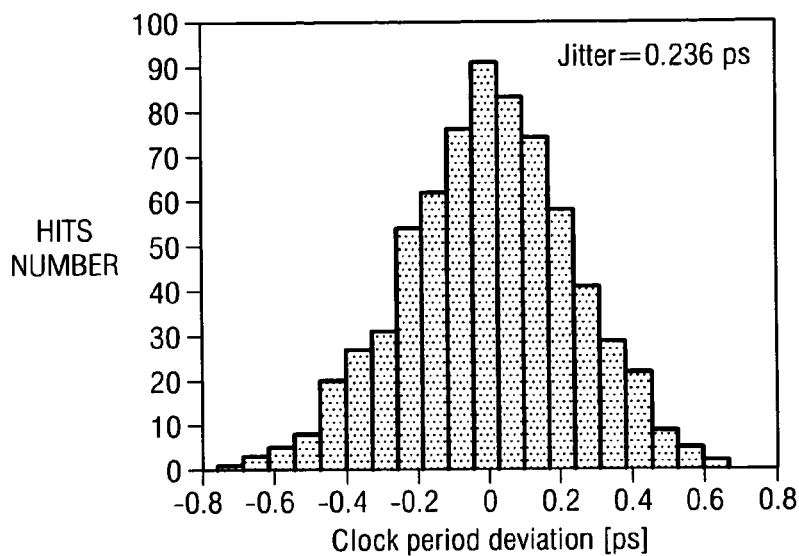
FIG. 8 shows simulation results for the distribution of clock period deviation for a CMOS preamplifier circuit of the present invention with diode clamps.

FIG. 7 illustrates results of simulating a clock-signal preamplifier circuit of the present invention using complementary pairs of differentially coupled CMOS transistors with diode clampers, similar to the circuit illustrated in FIG. 6. The diode clampers allow the use of 3.3-volt devices for a ±2.7-volt bias source, since the drain terminals do not swing the full supplied voltage range. The devices have been sized for maximum slope (about 7.3 V/ns against about 10 V/ns for the bipolar equivalent circuit). The output voltage signal is clamped at approximately ±1 volt by the diode clampers, and exhibits very rapid voltage swings at the voltage transition points. The top graph shows the output voltage signal (the voltages at the differential pair of output circuit nodes of the preamplifier, VINTP and VINTN), and the bottom graph shows the slope of the output voltage signal of the preamplifier VINTN. FIG. 8 illustrates the Gaussian distribution of the clock period obtained by Spice transient noise simulation, indicating timing jitter of 236 fs.

Figure 9:
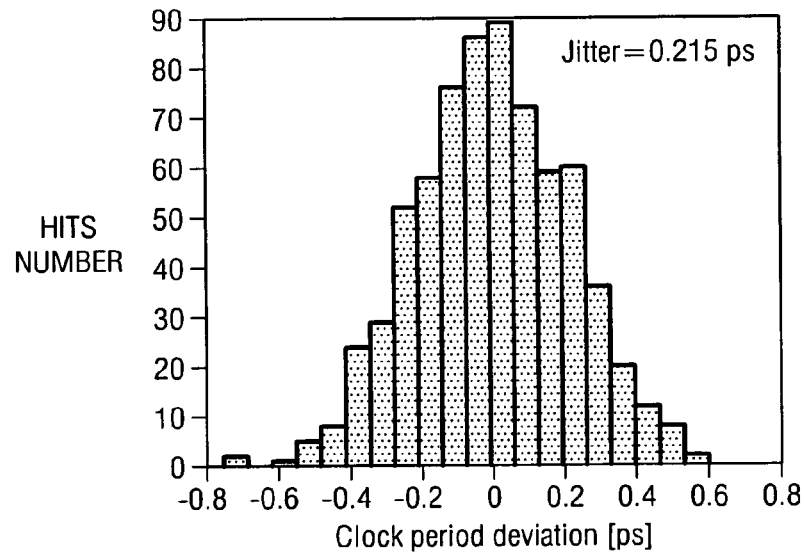
FIG. 9 shows simulation results for the distribution of clock period deviation for a CMOS preamplifier circuit of the present invention using 3.3-volt rated devices without diode clamps.

FIG. 9 illustrates the Gaussian distribution of the clock period from simulating a clock-signal preamplifier circuit of the present invention using complementary pairs of differentially coupled CMOS transistors, similar to the circuit illustrated in FIG. 6, but now omitting the diode clampers (as shown in FIG. 6A). The CMOS transistors were rated at 3.3 volts in this simulation, which poses a reliability issue for these devices. Nonetheless, the timing jitter is only 215 fs, illustrating that the diode clampers are not an essential element of the circuit when constructing the preamplifier with CMOS devices.

Figure 11:
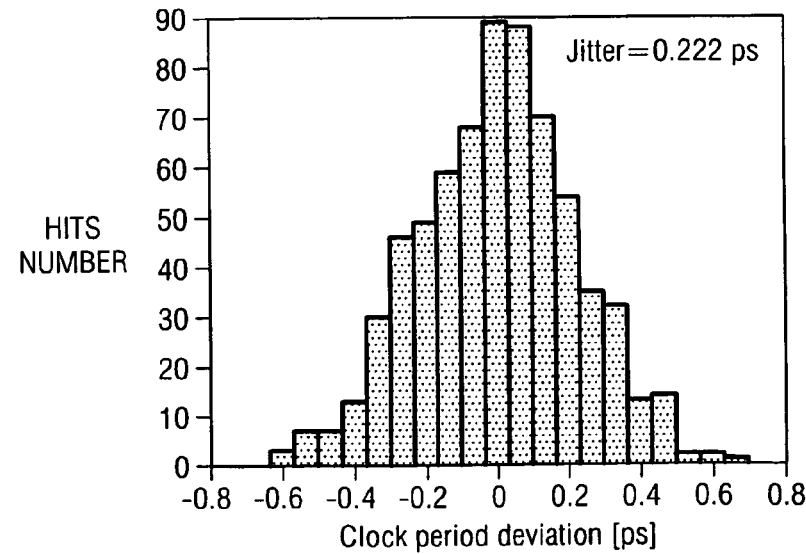
FIG. 11 shows simulation results for the distribution of clock period deviation for a CMOS preamplifier circuit of the present invention using 5-volt devices without diode clamps.
Figure 10:
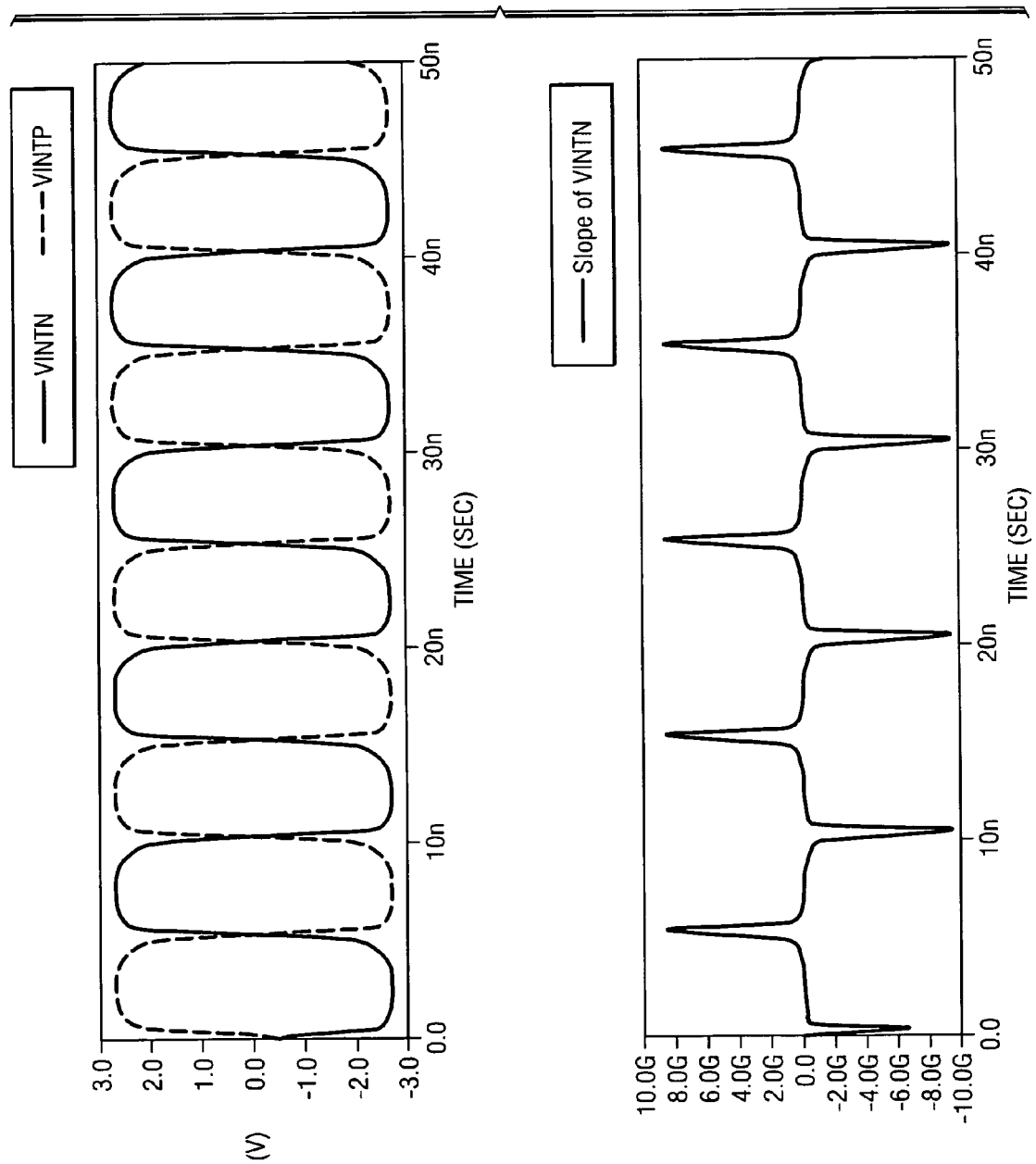
FIG. 10 shows simulation results for a CMOS clock signal preamplifier circuit of the present invention using 5-volt devices without diode clamps.

FIG. 10 illustrates results of simulating a clock-signal preamplifier circuit of the present invention using complementary pairs of differentially coupled CMOS transistors, similar to the circuit illustrated in FIG. 6, again omitting the diode clampers as shown in FIG. 6A. In this simulation, 5-volt CMOS transistors were used. The top graph shows the output voltage signal (the voltages at the differential pair of output circuit nodes of the preamplifier, VINTN and VINTP), and the bottom graph shows the slope of the output voltage signal VINTN. FIG. 11 shows the Gaussian distribution of the clock period timing jitter, indicating an rms timing jitter of 222 fs which demonstrates how even slower devices, such as 5-volt rated MOSFETs, can exploit the advantage of the disclosed topology and at the same time not require the capacitive burden of diode clampers, allowing for very fast transition edges, which in turn warrant state-of-the-art jitter figures.

The clock-signal preamplifier described herein can reduce the noise introduced by the clock generation and distribution network down to 107 fs as estimated by simulation, enabling 149 fs total aperture jitter for the clock chain, simulated at a final Sample/Hold sampling switch. Moreover, it affords high speed of operation (operation in excess of 125 MHz has been successfully simulated), and can drive a standard CMOS clock distribution chain. This translates into very low, state-of-the-art, aperture timing jitter figures at a sampling switch, which ultimately improves the SNR for a sampled-signal system. In particular, the new circuit yields dramatic SNR performance enhancement for a switched-capacitor analog-to-digital converter.

The new circuit has been incorporated into a novel clock structure that was implemented for a high-speed (65+MS/s), high-input frequency circuit arrangement for use in receivers with up to 225 MHz IF (intermediate frequency) with a 16-bit ADC. The jitter contributed by the preamplifier alone was reduced from 300+fs to 107 fs, as determined by simulation using an ad-hoc transient noise technique. Simulation of timing jitter is described by A. Zanchi, et al., in the paper "A 16-Bit 65 MS/s 3.3 V Pipeline ADC Core in SiGe BiCMOS with 78-dB SNR and 180 fs Jitter," as cited above. The optimized aperture sampling noise boosted the theoretical SNR performance of the ADC from about 67 dBFS (dB referenced to 0 dB at full scale voltage) at 225 MHz input to as high as 76.4 dBFS in the same operating conditions, where the noise of the system was largely dominated by the preamplifier jitter.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, and utilization of techniques to form the processes and systems providing reduced timing jitter as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A digital signal processing system comprising a clock signal preamplifier that converts an input signal to an output signal, the clock signal preamplifier comprising:
    first and second transistors of first conductivity type, each having first and second primary terminals and a control terminal, differentially coupled relative to each other, with their first terminals commonly coupled to a first circuit voltage node;
    third and fourth transistors of second conductivity type, opposite the first conductivity type, each having first and second primary terminals and a control terminal, differentially coupled relatively to each other, with their first terminals commonly coupled to a second circuit voltage node; and complementarily coupled to the first and second transistors, with the second terminals of the first and third transistors commonly coupled to provide a first component of a differential output signal and the second terminals of the second and fourth transistors commonly coupled to provide a second component of the differential output signal;
    phase splitter circuitry connected and configured for receiving and splitting the phase of respective first and second components of a differential input signal, and for providing first and second phase split outputs corresponding to the first and second components to the control inputs of the first, third, second and fourth transistors, respectively; and
    clamper circuitry coupled to a reference voltage node, and connected and configured for clamping voltages of the first and second components of the differential output signal, respectively.

2. The digital signal processing system according to claim 1, wherein the first and second transistors are bipolar transistors of one of PNP and NPN types; the third and fourth transistors are bipolar transistors of the other of PNP and NPN types.

3. The digital signal processing system according to claim 1, wherein the preamplifier is further configured to couple the first and second components of the differential output signal to respective first and second inverters, each inverter comprising a totem-pole arrangement of complementary MOSFET transistors.

4. The digital signal processing system according to claim 3, wherein the clamper circuitry further comprises:
    a pair of diode clamper circuits comprising clamper transistors having commonly connected control terminals, and commonly connected other terminals respectively coupled to the commonly coupled second terminals of the first and third transistors and the commonly coupled second terminals of the second and fourth transistors; and
    at least one reference voltage source coupled to the control terminals of the clamper transistors.

5. The digital signal processing system according to claim 4, wherein the clamper transistors are bipolar transistors.

6. The digital signal processing system according to claim 4, wherein the reference voltage source comprises a second totem-pole arrangement of complementary MOSFET transistors with an output node and an input node, and the output node is coupled to the input node.

7. The digital signal processing system according to claim 4, wherein the reference voltage source coupled to the control terminals of the clamper transistors is by-passed with a capacitor to one of the first circuit voltage node, the second circuit voltage node, or ground of the circuit.

8. A method of providing a preamplified output clock signal from an input clock signal, comprising the steps of:
    providing complementary pairs of differentially coupled transistors coupled to sense the input clock signal; and
    producing the output clock signal using the differentially coupled transistors;
    coupling a pair of diode clamper circuits comprising clamper transistors to the complementary pairs of differentially coupled transistors; and
    coupling at least one reference voltage source to the control terminals of the clamper transistors;
    wherein the complementary pairs of differentially coupled transistors comprise:
    first and second transistors of first conductivity type, each having first and second primary terminals and a control terminal, differentially coupled relative to each other, with their first terminals commonly coupled to a first circuit voltage node; and
    third and fourth transistors of second conductivity type, opposite the first conductivity type, each having first and second primary terminals and a control terminal, differentially coupled relatively to each other, with their first terminals commonly coupled to a second circuit voltage node; and complementarily coupled to the first and second transistors, with the second terminals of the first and third transistors commonly coupled to provide a first component of a differential output signal and the second terminals of the second and fourth transistors commonly coupled to provide a second component of the differential output signal; and
    wherein phase split parts of first and second components of a differential input signal are respectively provided to the control inputs of the first, third, second and fourth transistors.

9. The method according to claim 8, including using bipolar transistors for the complementary pairs of differentially coupled transistors.

10. The method according to claim 8, including using bipolar transistors for the clamper transistors.

11. The method according to claim 8, further comprising the step of by-passing the reference voltage source to one of the first circuit voltage node, the second circuit voltage node, or ground of the circuit with a capacitor.

12. A clock signal preamplifier, comprising:
    first and second transistors of first conductivity type, each having first and second primary terminals and a control terminal, differentially coupled relative to each other, with their first terminals commonly coupled to a first circuit voltage node;

third and fourth transistors of second conductivity type, opposite the first conductivity type, each having first and second primary terminals and a control terminal, differentially coupled relatively to each other, with their first terminals commonly coupled to a second circuit voltage node; and complementarily coupled to the first and second transistors, with the second terminals of the first and third transistors commonly coupled to provide a first component of a differential output signal and the second terminals of the second and fourth transistors commonly coupled to provide a second component of the differential output signal;

phase splitter circuitry connected and configured for receiving and splitting the phase of respective first and second components of a differential input signal, and for providing first and second phase split outputs corresponding to the first and second components to the control inputs of the first, third, second and fourth transistors, respectively; and clamper circuitry coupled to a reference voltage node, and connected and configured for clamping voltages of the first and second components of the differential output signal, respectively.

13. The clock signal preamplifier according to claim 12, wherein the preamplifier is further configured to couple the first and second components of the differential output signal to respective first and second inverters, each inverter comprising a totem-pole arrangement of complementary MOSFET transistors.

14. The clock signal preamplifier according to claim 12, wherein the clamper circuitry further comprises:
a pair of diode clamper circuits comprising clamper transistors having commonly connected control terminals, and commonly connected other terminals respectively coupled to the commonly coupled second terminals of the first and third transistors and the commonly coupled second terminals of the second and fourth transistors; and
at least one reference voltage source coupled to the control terminals of the clamper transistors.

15. The clock signal preamplifier according to claim 14, wherein the clamper transistors are bipolar transistors.

16. The clock signal preamplifier according to claim 14, wherein the reference voltage source comprises a second totem-pole arrangement of complementary MOSFET transistors with an output node and an input node, the output node coupled to the input node.

17. The clock signal preamplifier according to claim 16, wherein MOSFET transistors of the reference voltage source and corresponding MOSFET transistors of the inverter are configured to have substantially identical threshold voltages.

18. The clock signal preamplifier according to claim 14, wherein the reference voltage source coupled to the control terminals of the clamper transistors is by-passed with a capacitor to one of the first circuit voltage node, the second circuit voltage node, or ground of the circuit.

19. The clock signal preamplifier according to claim 12, wherein the first and second transistors are bipolar transistors of one of PNP and NPN types; the third and fourth transistors are bipolar transistors of the other of PNP and NPN types.

20. The clock signal preamplifier according to claim 19, wherein the first terminals are respective emitters, the second terminals are respective collectors, and the control terminals are respective bases of the first, second, third and fourth transistors.

21. The clock signal preamplifier according to claim 12, wherein the first and second transistors are transistors of one of PMOS and NMOS types; the third and fourth transistors are transistors of the other of PMOS and NMOS types.

22. The clock signal preamplifier according to claim 21, wherein the first terminals are respective sources, the second terminals are respective drains, and the control terminals are respective gates of the first, second, third and fourth transistors.

* * * * *